(12) United States Patent
Zhang et al.

(10) Patent No.: US 11,979,169 B2
(45) Date of Patent: May 7, 2024

(54) DIGITAL TO ANALOG CONVERTER

(71) Applicant: NXP USA, Inc., Austin, TX (US)

(72) Inventors: Yizhong Zhang, Suzhou (CN); Stefano Pietri, Austin, TX (US); Jie Jin, Suzhou (CN); Michael Todd Berens, Austin, TX (US)

(73) Assignee: NXP USA, Inc., Austin, TX (US)

(*) Notice: Subject to any disclaimer, the term of this patent is extended or adjusted under 35 U.S.C. 154(b) by 145 days.

(21) Appl. No.: 17/812,542

(22) Filed: Jul. 14, 2022

(65) Prior Publication Data
US 2023/0031469 A1   Feb. 2, 2023

(30) Foreign Application Priority Data

Jul. 29, 2021   (CN) .......................... 202110865150.9

(51) Int. Cl.
H03M 1/68   (2006.01)
H03M 1/78   (2006.01)

(52) U.S. Cl.
CPC .......... *H03M 1/687* (2013.01); *H03M 1/785* (2013.01)

(58) Field of Classification Search
CPC .............................. H03M 1/687; H03M 1/785
USPC ................................................. 341/144–145
See application file for complete search history.

(56) References Cited

U.S. PATENT DOCUMENTS

| 5,627,537 | A | 5/1997 | Quinlan et al. |
| RE38,083 | E | 4/2003 | Ashe |
| 6,633,246 | B1 | 10/2003 | Bowers |
| 8,581,766 | B1 | 11/2013 | Li et al. |
| 9,083,380 | B2 | 7/2015 | Price et al. |
| 10,014,877 | B1 * | 7/2018 | Garg ........................ H03M 1/68 |
| 10,784,886 | B1 * | 9/2020 | Zhang .................. H03M 1/785 |
| 2014/0266835 | A1 | 9/2014 | Price et al. |
| 2016/0056834 | A1 | 2/2016 | Frank |

FOREIGN PATENT DOCUMENTS

| WO | WO-1996016481 A1 | 5/1996 |
| WO | WO-2002013392 A2 | 2/2002 |

OTHER PUBLICATIONS

Xu et al.: "Research of segmented 8bit voltage-mode R-2R ladder DAC," 2015 IEEE 11th International Conference on ASIC (ASICON), Nov. 3-6, 2015, Chengdu, China, DOI: 10.1109/ASICON.2015.7517105, pp. 1-4.

* cited by examiner

*Primary Examiner* — Khai M Nguyen

(57) ABSTRACT

A digital to analog converter (DAC) includes an amplifier including a buffer of the DAC, and a resistor ladder arrangement coupled to a non-inverting input terminal of the amplifier to generate a voltage based on a digital control word. The arrangement includes a first, least-significant bit, segment arranged in one of an R-2R or unit-R configuration, a second, most-significant bit, segment including one or more units each including a second-segment-resistor having a resistor terminal coupled to a respective second switch and having a second resistance, $R_{MSB}$, and a third segment including one or more third-segment-resistors coupled in parallel to the non-inverting input terminal and connected to a first reference voltage terminal. M2 designates a number of bits in the digital control word for controlling the second switches, and the third segment has a total resistance, Rsp, based on M2.

19 Claims, 4 Drawing Sheets

DIGITAL TO ANALOG CONVERTER

CROSS-REFERENCE TO RELATED APPLICATIONS

This application claims the priority under 35 U.S.C. § 119 of China application no. 202110865150.9, filed on 29 Jul. 2021, the contents of which are incorporated by reference herein.

FIELD

The present disclosure relates to a digital to analog converter, DAC. In particular, it relates to a DAC having a resistor ladder arrangement and an amplifier to act as a buffer, wherein the resistor ladder arrangement includes a first segment comprising a least-significant bit segment, a second segment comprising a most-significant bit segment and a third segment.

BACKGROUND

A buffered voltage type DAC is an important member of the DAC family. Accuracy, such as in terms of linearity, and speed are key features.

SUMMARY

According to a first aspect of the present disclosure there is provided a digital to analog converter, DAC, comprising:
an amplifier for forming a buffer of the DAC, the amplifier comprising an inverting input terminal and a non-inverting input terminal and an output terminal for providing an output of the DAC, wherein the inverting input terminal is coupled to a first reference voltage terminal via a first resistor, the first reference voltage terminal configured to receive a first reference voltage and wherein the output terminal is coupled to the inverting input terminal via a second resistor; and
a resistor ladder arrangement coupled to the non-inverting input terminal of the amplifier and configured to generate a voltage at said non-inverting input terminal based on a digital control word, wherein the resistor ladder arrangement comprises:
i) a first segment comprising a plurality of first-segment-resistors and one or more first switches, said first segment coupled to the non-inverting input terminal of the amplifier, and each of the one or more first switches configured to individually and selectively couple a respective first-segment-resistor of the plurality of first-segment-resistors to either the first reference voltage terminal or a second reference voltage terminal that is configured to receive a second reference voltage, different from the first reference voltage, and wherein the plurality of first-segment-resistors and the one or more first switches are arranged in one of: an R-2R configuration and a unit-R configuration;
ii) a second segment comprising one or more units, each unit comprising a second-segment-resistor having a first resistor terminal and a second resistor terminal wherein the second resistor terminal is coupled to a respective second switch, wherein the one or more units are coupled, in parallel, to the non-inverting input terminal by the first resistor terminal of the second-segment-resistor of each of the one or more units, wherein each respective second switch is configured to individually and selectively couple the respective second resistor terminal to either the first reference voltage terminal or the second reference voltage terminal, wherein each second-segment-resistor of the one or more units of the second segment has a second resistance value, $R_{MSB}$;
iii) a third segment comprising one or more third-segment-resistors, each of the one or more third-segment-resistors of the third segment having a first resistor terminal and a second resistor terminal, wherein each of the one or more third-segment-resistors of the third segment are coupled in parallel to the non-inverting input terminal by their first resistor terminal and, by their second resistor terminal, are connected to the first reference voltage terminal, wherein the one or more third-segment-resistors of the third segment have a total, third resistance value based on the second resistance value and a number of bits in the digital control word for controlling said second switches of the one or more units of the second segment; and
wherein said first switches of the first segment are configured to be controlled by a first part of the digital control word comprising one or more of the least significant bits of the digital control word, and the second switches of the second segment are configured to be controlled by a second part of the digital control word comprising one or more of the most significant bits of the digital control word, and thereby control of the first switches and the second switches controls the output of the DAC at the output terminal.

In one or more examples, the third segment comprises two or more third-segment-resistors.

In one or more examples, the third segment is for providing immunity to variable IR drop. In one or more examples, the third segment is for improving the total unadjusted error of the DAC. In one or more examples, the first segment forms a least-significant-bit segment. In one or more examples, the second segment forms a most-significant-bit segment.

In one or more embodiments, $Rsp=R_{MSB}/2^{M2}$ wherein Rsp comprises the third resistance value and M2 comprises the number of bits in the digital control word for controlling said second switches of the one or more units of the second segment. In one or more embodiments, $Rsp=R_{MSB}/2^{M2} \pm a$ threshold value wherein Rsp comprises the third resistance value and M2 comprises the number of bits in the digital control word for controlling said second switches of the one or more units of the second segment. In one or more embodiments, the threshold value comprises the resistance of each of the first-segment-resistors $R_{LSB}$ or the total resistance of the first segment.

In one or more examples, one of the plurality of first-segment-resistors comprises a termination resistor and the remaining resistors of the plurality of first-segment-resistors form the one of the R-2R configuration and the unit-R configuration with the one or more first switches, wherein the termination resistor comprises a first resistor terminal coupled to the one of the R-2R configuration and the unit-R configuration and comprises a second resistor terminal coupled to the first reference voltage terminal.

In one or more embodiments, the R-2R arrangement of the first segment comprises one or more first-segment-units arranged in a chain, wherein
a first of the one or more first-segment-units comprises a first unit resistor of the plurality of first-segment-resistors having a resistance $R_{LSB}$ and a second unit resistor of the plurality of first-segment-resistors having a resistance $2 \cdot R_{LSB}$, and a first unit switch comprising one of the one or more first switches, wherein the first unit resistor is coupled between the non-inverting input terminal and an intermediate node of the first of the first-segment-units and the second unit resistor is coupled between the intermediate node and said first unit switch; and wherein each subsequent first-segment-unit of the one or more first-segment-units comprises a first unit resistor of the plurality of first-segment-resistors having a resistance $R_{LSB}$ and a second unit resistor of the plurality of first-segment-resistors having a resistance $2 \cdot R_{LSB}$, and a subsequent unit switch comprising one of the first switches, wherein the first unit resistor of said subsequent first-segment-unit is coupled between the intermediate node of a preceding first-segment-unit in the chain and an intermediate node of said subsequent first-segment-unit and the second unit resistor of said subsequent first-segment-unit is coupled between the intermediate node of said subsequent first-segment-unit and the subsequent unit switch; and wherein the first segment comprises a termination resistor of the plurality of first-segment-resistors having a first resistor terminal coupled to the intermediate node of a final first-segment-units arranged in the chain and a second resistor terminal coupled to the first reference voltage terminal.

In one or more embodiments, the resistance $2R_{LSB}$ is equal to $R_{MSB}$.

In one or more embodiments, the unit-R arrangement of the first segment comprises one or more first-segment-units arranged in a chain, wherein a first of the one or more first-segment-units comprises a first unit resistor of the plurality of first-segment-resistors having a resistance $R_{UNITR}$ and a second unit resistor of the plurality of first-segment-resistors having a resistance $2 \cdot R_{LSB}$, and a first unit switch comprising one of the one or more first switches, wherein the first unit resistor is coupled between the non-inverting input terminal and an intermediate node of the first of the first-segment-units and the second unit resistor is coupled between the intermediate node and said first unit switch; and wherein each subsequent first-segment-unit of the one or more first-segment-units comprises a first unit resistor of the plurality of first-segment-resistors having a resistance $2 \cdot R_{LSB}$ coupled between the intermediate node of the first of the first-segment-units and a subsequent unit switch of the one or more first switches; and wherein the first segment further comprises a termination resistor of the plurality of first-segment-resistors having a first resistor terminal coupled to the intermediate node of the first of the first-segment-units and a second resistor terminal coupled to the first reference voltage terminal.

In one or more embodiments, the resistance $R_{UNITR}$ comprises $$\frac{2^L - 1}{2^L} \cdot 2R_{LSB}$$

wherein L comprises the number of first-segment-units.

In one or more embodiments, the total output impedance of the first segment is equal to $R_{MSB}$.

In one or more embodiments, the number of third-segment-resistors in the third segment is equal to $2^{M2}$.

In one or more embodiments, the number of third-segment-resistors in the third segment is equal to $2^{M2}/N$, wherein N is an integer greater than one and wherein the resistance of each of the third-segment-resistors is $R_{MSB}/N$. In one or more examples N is greater than 2, greater than 3, greater than 4 or greater than 5.

In one or more embodiments, the amplifier is configured to be powered by virtue of being coupled to a third voltage reference terminal and a fourth voltage reference terminal, wherein the third voltage reference terminal is configured to receive a supply voltage equal to or greater than the second reference voltage and the fourth voltage reference terminal is configured to receive a ground reference voltage and the first reference voltage is equal to or greater than the ground reference voltage.

In one or more embodiments, the fourth voltage reference terminal is configured to be coupled to a ground reference voltage and a resistance of the first resistor of the buffer is equal to a resistance of the second resistor of the buffer.

In one or more examples, the amplifier is configured such that the voltage provided at the output terminal, VO_DAC, is as follows:

$$\text{VO\_DAC} = \frac{Rfb1}{Rfb1 + Rfb2} * \text{VO\_LADDER},$$

wherein Rfb1 is the resistance of the first resistor, Rfb2 is the resistance of the second resistor and VO_LADDER is the voltage provided to the non-inverting input by the resistor ladder arrangement.

In one or more embodiments, the DAC includes a binary-to-thermometer decoder configured to receive the second part of the digital control word, the output from the binary-to-thermometer decoder configured to control the second switches of the second segment.

In one or more embodiments, the first segment comprises a unit-R configuration and the DAC includes a second binary-to-thermometer decoder configured to receive the first part of the digital control word, the output from the second binary-to-thermometer decoder configured to control the first switches of the first segment.

In one or more embodiments, the first segment comprises an R-2R configuration and the DAC includes a delay equalizer, the delay equalizer configured to receive the first part of the digital control word from the controller, the output from the delay equalizer configured to control the first switches of the first segment.

In one or more embodiments, at least one of the one or more third-segment-resistors has its second resistor terminal coupled to the first reference voltage terminal via a third switch, the third switch configured to selectively connect or disconnect the at least one or more third resistors from the first reference voltage terminal.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

BRIEF DESCRIPTION OF THE DRAWINGS

One or more embodiments will now be described by way of example only with reference to the accompanying drawings in which.

DETAILED DESCRIPTION

The present disclosure relates to a digital to analog convertor, DAC, and, in particular, a buffered voltage type DAC. Such a DAC may be required to balance accuracy, speed and current consumption.

DACs may use a resistor ladder arrangement of resistors and switches to selectively couple the resistors to different voltage references in accordance with a digital control word. Accordingly, each bit of the digital control word, wherein the digital control word may control the action of a respective one (or more) of the switches, as will be described below. The resistor ladder arrangement effectively comprises an interconnected set of voltage dividers that each contribute to an output voltage at an output of the resistive ladder arrangement. Thus, the selective coupling, by the switches, of the resistors of the resistor ladder arrangement to at least two different voltage references provides for a voltage to be created based on the digital control word. The output of the resistive ladder arrangement may be provided to a buffer, which may be embodied as an operational amplifier.

Figure 1:
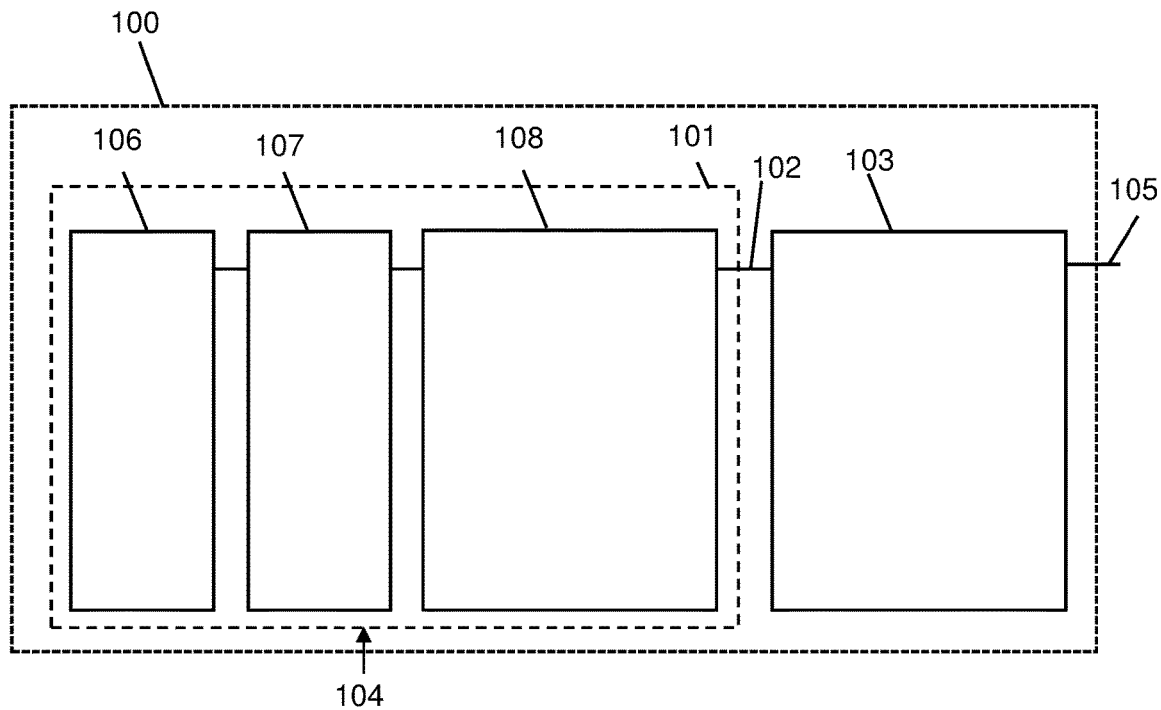
FIG. 1 shows a first example embodiment of a DAC of the present disclosure.

FIG. 1 shows a DAC 100 comprising a resistor ladder arrangement 101 configured to provide an output voltage at an input 102 of a buffer 103 based on a digital control word, received at digital input 104 comprising a digital control word. The buffer 103 may comprise an operational amplifier. An output 105 of the buffer 103 forms the analog output of the DAC. The resistor ladder arrangement 101 includes a plurality of resistors and a plurality of switches. The switches are controlled by the bits of the digital control word and determine whether the resistors to which they are coupled are connected to a first reference voltage or a second reference voltage. The first reference voltage may be a lower voltage than the second reference voltage. The first and second reference voltages may both be positive voltages (or the first reference voltage may be at ground).

In the present example, the resistive ladder arrangement 101 is divided into a first segment 106 and a second segment 107. In other examples, one or more further segments may be provided to receive bits of the digital control word between the lesser significant bits and the most significant bits. The first segment 106 comprises a least significant bit segment or LSB segment and, as such, is configured to receive one or more of the lesser significant bits of the digital control word including the least significant bit of the digital control word. The second segment 107 comprises a most significant bit segment or MSB segment and, as such, is configured to receive one or more of the bits of greater significance than the lesser significant bits of the digital control word including the most significant bit of the digital control word. Thus, for a control word of bits $B_6B_5B_4B_3B_2B_1$, the first segment 106 (or switches thereof) may be controlled by a first part comprising the contiguous lesser significant bits, such as the three bits $B_3$, $B_2$ and $B_1$ and the second segment 107 (or switches thereof) may be controlled by a second (non-overlapping) part comprising the contiguous bits of greater significance, such as the three bits $B_6$, $B_5$ and $B_4$. Thus, the least significant bit segment that is coupled to the lesser significant bits of the digital control word will causes a change in the output voltage at output 102 that is smaller than the a change in the output voltage at output 102 caused by control of the second segment 107 by the second part of the digital control word. The resistive ladder arrangement 101 has a different configuration in the first, LSB, segment 106 relative to the second, MSB, segment 107.

Figure 2:
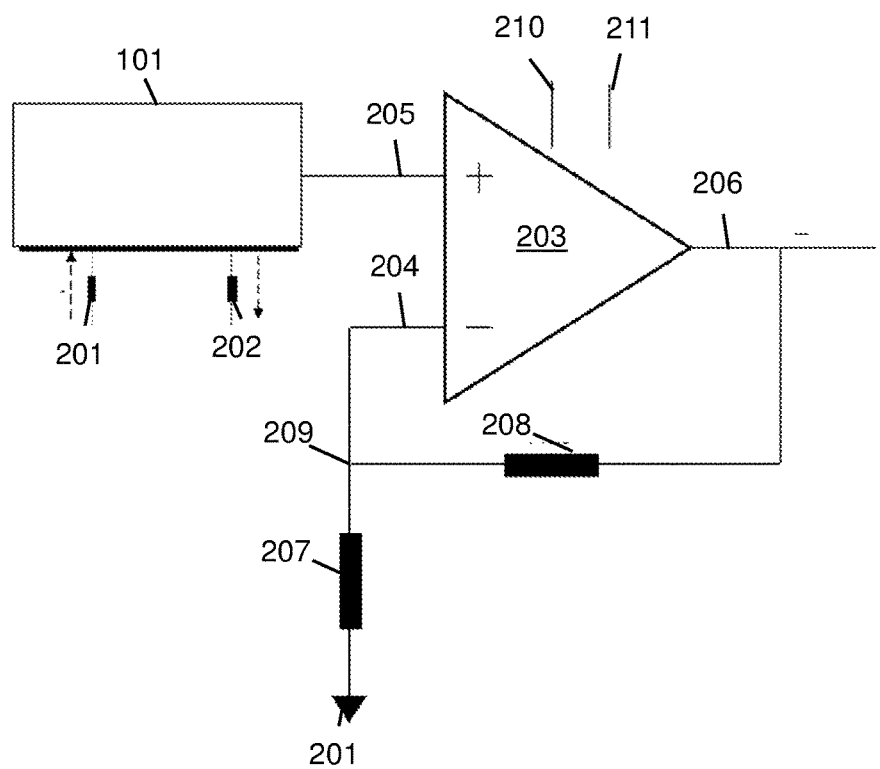
FIG. 2 shows an example amplifier or buffer of the DAC of the present disclosure.

FIG. 2 shows more detail of the buffer 103 and shows a simplified resistive ladder arrangement 101. The resistive ladder arrangement 101 is coupled or, in particular, a terminal of each of the plurality of switches of the resistive ladder arrangement 101 is coupled to a first reference voltage terminal 201. The first reference voltage terminal 201 is configured to receive a first reference voltage. The resistive ladder arrangement 101 is coupled or, in particular, a further terminal of each of the switches is coupled to a second reference voltage terminal 202. The second reference voltage terminal 202 is configured to receive a second reference voltage.

The buffer 103 may be embodied as an operational amplifier 203. The amplifier 203 comprises an inverting input terminal 204 and a non-inverting input terminal 205 and an output terminal 206 for providing an output 105 of the DAC. The inverting input terminal 204 is coupled to the first reference voltage terminal 201 via a first resistor, Rfb1, 207. The first reference voltage terminal 201 is configured to receive the first reference voltage, VL. The output terminal 206 is coupled to the inverting input terminal 204 via a second resistor, Rfb2, 208. Thus, the second resistor 208 forms a feedback loop between the output 206 and the inverting input terminal 204. A first terminal of the first resistor 207 is coupled at a node 209 between the second resistor 208 and the inverting input terminal 204. A second terminal of the first resistor 207 is coupled to said first reference voltage terminal 201.

The amplifier 203 is powered by way of two terminals comprising a third voltage reference terminal 210 and a fourth voltage reference terminal 211. The third voltage reference terminal 210 is configured to receive a supply voltage, VDDA, equal to or greater than the second reference voltage, VH. The fourth voltage reference terminal 211 is configured to receive a ground reference voltage. The first reference voltage, VL, is equal to or greater than the ground reference voltage.

In one or more examples, the fourth voltage reference terminal 211 is configured to be coupled to a ground reference voltage and the resistance of the first resistor 208 is equal to a resistance of the second resistor 207.

The arrangement of the first and second resistors 207, 208 of the amplifier 203 is such that the voltage provided at the output terminal 206, termed VO_DAC, is as follows:

$$\text{VO\_DAC} = \frac{Rfb1}{Rfb1 + Rfb2} * \text{VO\_LADDER},$$

wherein Rfb1 is the resistance of the first resistor 207, Rfb2 is the resistance of the second resistor 208 and VO_LADDER is the voltage provided to the non-inverting input 205 by the resistor ladder arrangement 101.

Figure 3:
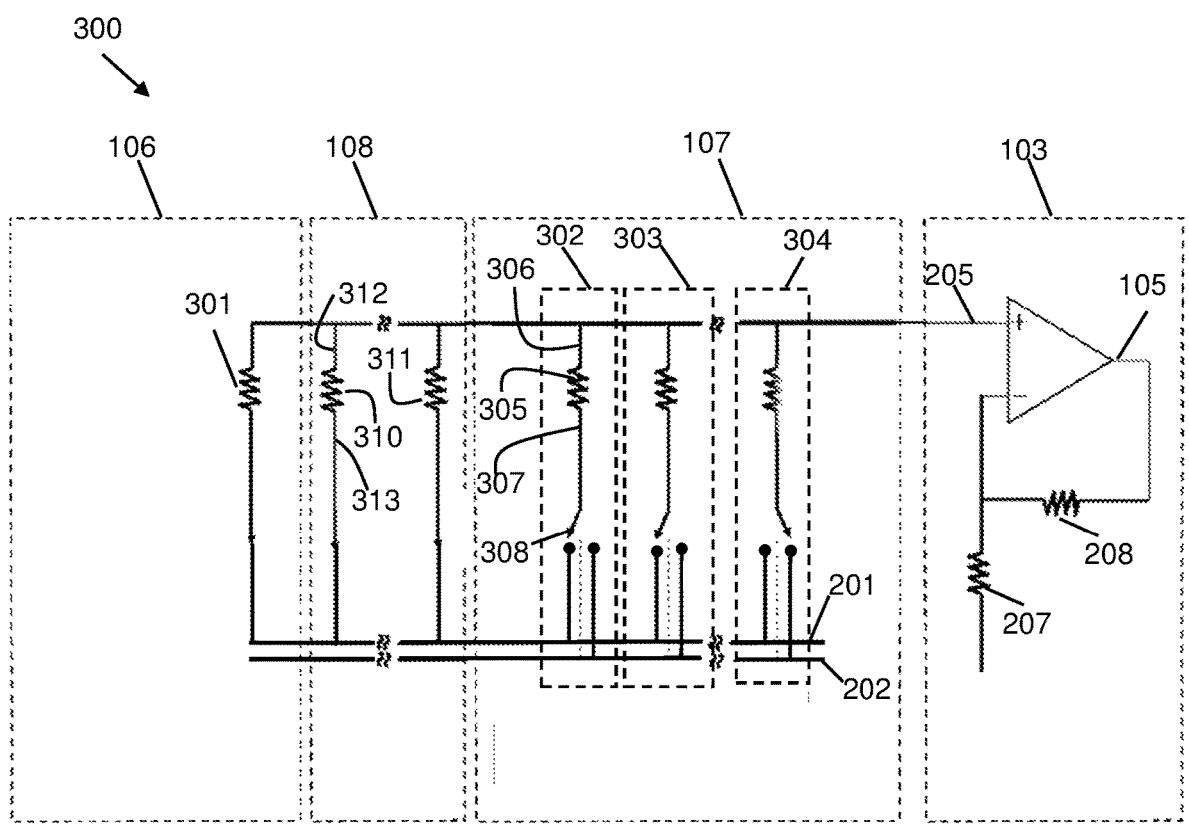
FIG. 3 shows a second example embodiment of a DAC of the present disclosure.

FIG. 3 shows a more detailed view of an example embodiment of the DAC 300. The amplifier 103 is shown coupled at non-inverting input terminal 102 to the segments 106, 107, 108 of the resistor ladder arrangement.

Figure 4:
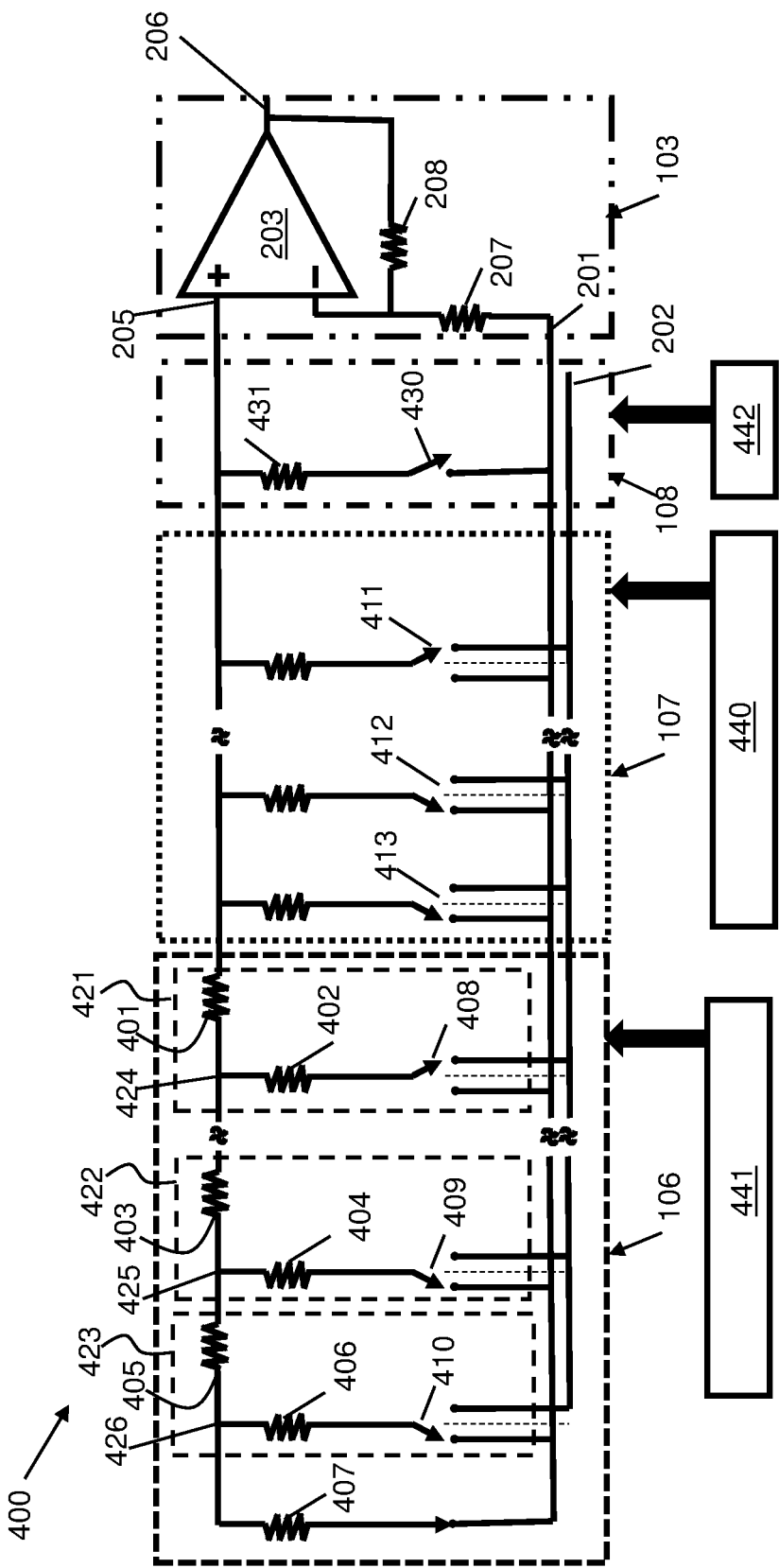
FIG. 4 shows a third example embodiment of a DAC of the present disclosure in which the first segment comprises a R-2R configuration.
Figure 5:
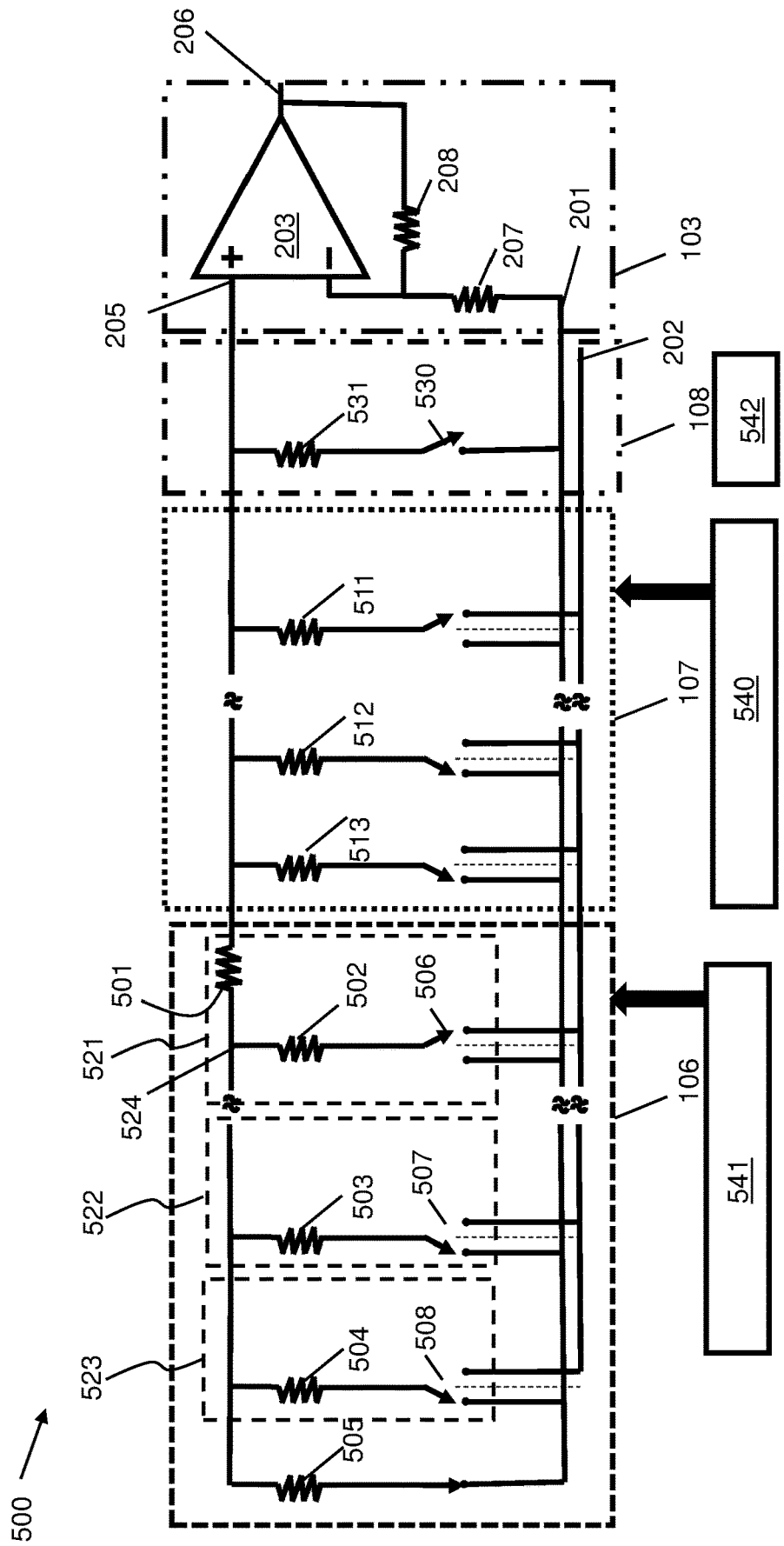
FIG. 5 shows a fourth example embodiment of a DAC of the present disclosure in which the first segment comprises a unit-R configuration or "segment unit-R" configuration.

The first segment 106 of the resistor ladder arrangement 101 comprises a plurality of first-segment-resistors 301 (only one shown, but shown as 401-407 in FIGS. 4 and 501-505 in FIG. 5) and one or more first switches (not shown in FIG. 3 but shown as 408-410 in FIGS. 4 and 506-508 in FIG. 5). Each of the one or more first switches 408-410, 506-508 are configured to individually and selectively couple a respective first-segment-resistor 301, 402, 404, 406, 502-504 of the plurality of first-segment-resistors to either the first reference voltage terminal 201 or to a second reference voltage terminal 202. The plurality of first-segment-resistors 301, 401-407, 501-505 and the one or more first switches 408-410 and 506-508 are arranged in one of; an R-2R configuration (shown in example FIG. 4) and a unit-R configuration (shown in example FIG. 5). Such resistor ladder configurations are known to those skilled in the art of resistor ladder based DACs.

In summary, the R-2R configuration comprises one or more units 421-423 arranged in a chain, each unit comprising two first-segment resistors, one having a resistance R 401, 403, 405 and the other having a resistance 2R 402, 404, 406. The two first-segment resistors are arranged in series wherein the 2R first-segment resistor is coupled to a first switch 408, 409, 410, and wherein a first of the one or more units couples to the non-inverting input 205 by the R resistor, and each subsequent unit couples to a node 424-426 of a preceding unit in the chain, the node being located between the R and 2R resistors of said preceding unit. In summary, the unit-R configuration, also known to those skilled in the art as a segment-unit-R configuration comprises a first unit resistor 501 coupled to the non-inverting input terminal 205 by one resistor terminal and one or more further resistors 502-505 coupled to the segment resistor's other resistor terminal in parallel, each of the further resistors also coupled to the respective first switch 506-508.

The number of switches in the first segment 106, which are configured to receive the lesser bits of the digital control word, may comprise at least one, at least two, at least three, at least four or at least five or more. However, the variable M1 designates the number of bits of the digital control word (the number of bits in the first part) used to control the first segment 106, which, in this example, corresponds to the number of the one or more first switches.

In example FIG. 3, the R-2R configuration and unit-R configuration are represented diagrammatically by the resistor 301. However, it will be appreciated that the DAC 100, 300, 400, 500 of the present disclosure includes, as part of the first segment 106, at least one first-segment-resistor that is coupled to the non-inverting input terminal 205 by a first resistor terminal and its second resistor terminal is selectively switched by one of the one or more first switches between coupling to the first reference voltage terminal 201 and coupling to the second reference voltage terminal 202.

A more complete description of the R-2R and unit-R configurations will be provided below.

The second segment 107 shown in FIG. 3 comprises one or more units 302, 303, 304. The second segment 107 may be considered, in one or more examples, to comprise a unit-R configuration. Each unit 302, 303, 304 is substantially identical in structure and for simplicity only unit 302 is labelled in more detail. In particular, each unit comprises a second-segment-resistor 305 having a first resistor terminal 306 and a second resistor terminal 307 wherein the second resistor terminal 307 is coupled to a respective second switch 308. The one or more units 302, 303, 304 are coupled, in parallel, to the non-inverting input terminal 205 by the first resistor terminal 306 of the second-segment-resistor 305 of each of the one or more units 302, 303, 304. Each respective second switch 308 of the one or more units 302, 303, 304 is configured to individually and selectively couple the respective second resistor terminal 307 to either the first reference voltage terminal 201 or the second reference voltage terminal 202. Each of the second-segment-resistors 305 of the one or more units 302, 303, 304 of the second segment 107 has a second resistance, $R_{MSB}$. The number of units 302, 303, 304, corresponds with the number of second switches 308 in the second segment 107 to receive individual control signals based on the more significant bits of the digital control word. The number of units 302, 303, 304 may comprise at least one, at least two, at least three, at least four or at least five, or more. However, the variable M2 will be used to designate the number of bits of the digital control word (i.e. the number of bits in the second part of the digital control word) used to control the second segment 107.

In one or more examples, the number of the one or more units is equal to $2^{M2}-1$. In this example of FIG. 3, three units 302, 303, 304 or three second switches 308 are shown in full and therefore M2=2 because $2^{M2=2}-1=3$. It will be appreciated that a binary to thermometer decoder may receive the two bits of the digital control word and generate the three individual control signals for the switches of the three units 302, 303, 304.

It has been found that providing a third segment 108, in one or more examples, may provide immunity to variable IR drop. The IR drop can be considered as the resistive voltage drop experienced as current flows through a resistor, as the resistance value varies, so does the voltage drop, leading a variable IR drop. IR drop is known to degrade the DAC's TUE (Total unadjusted error), wherein the TUE gives a single number that succinctly represents the accuracy of the linearity of DAC, including INL (Integral non-linearity)/EO (Offset error)/EG (Gain error). The third segment 108 comprises one or more third-segment-resistors 310, 311. In one or more examples, the third segment 108 comprises two or more third-segment-resistors 310, 311. Each of the one or more third-segment-resistors 310, 311 of the third segment 108 have a first resistor terminal 312 and a second resistor terminal 313 (only third-segment-resistor 310 is labelled with the resistor terminals for brevity). Each of the one or more third-segment-resistors 310, 311 of the third segment 108 are coupled, in parallel, to the non-inverting input terminal 205 by their respective first resistor terminal 312. The third-segment-resistors 310, 311 are also connected, by their respective second resistor terminals 307, to the first reference voltage terminal 201. The one or more third-segment-resistors of the third segment 108 have a total, third resistance, Rsp, wherein $Rsp = R_{MSB}/2^{M2}$ wherein M2 comprises the number of bits of the digital control word provided to a binary to thermometer decoder, wherein the binary to thermometer decoder is configured to provide an output to individually control the second switches 308 based on said digital control word and wherein the number of second switches or units 302-304 comprises $2^{M2}-1$. Such a value of Rsp may be advantageous for support of different gain settings of the amplifier 103.

In one or more other examples, Rsp=$R_{MSB}/2^{M2}$±a threshold value, wherein the threshold value may comprise an integer multiple of the total resistance of the first segment 106 or an integer multiple of $R_{LSB}$.

As mentioned above, said one or more first switches 408-410, 506-508 of the first segment 106 and the one or more second switches 308 (three shown in FIG. 3) of the second segment 107 are configured to be controlled by the digital control word (via 440, 441 and 540, 541) and thereby control the output of the DAC 100 at the output terminal 105.

Example FIG. 4 shows the first segment 106 in more detail and represents the optional R-2R configuration of said first segment 106. In the example of FIG. 4, the first segment 106 includes three first switches 408-410. The first segment receives three lesser significant bits of the digital control word in provision of the output of the DAC via the buffer 103.

In general, the R-2R arrangement of the first segment 106 comprises one or more first-segment-units 421, 422, 423 arranged in a chain and therefore a second first-segment-unit in the chain is coupled to the first in the chain and a third in the chain is coupled to the second in the chain and so on. Thus, the first-segment-units may be considered to be coupled in series with one another. In this example, three first-segment-units 421, 422, 423 are shown although it will be appreciated that the disclosure is not limited to three first-segment-units 421, 422, 423.

A first unit 421 of the one or more first-segment-units comprises a first unit resistor 401 of the plurality of first-segment-resistors mentioned above and having a resistance $R_{LSB}$ and a second unit resistor 402 of the plurality of first-segment-resistors having a resistance $2 \cdot R_{LSB}$. In one or more examples, the second unit resistor 402 that has a resistance $2 \cdot R_{LSB}$ may be provided by two of the first-segment-resistors that each have a resistance $R_{LSB}$. In such an example, all of the first-segment-resistors may have the resistance $R_{LSB}$ with the "2R" part of the R-2R provided by a pair of the first-segment-resistors in series. In another example, the resistance of the second unit resistor 402 can be formed by any combination of resistors resulting in a resistance value which corresponds to $2 \cdot R_{LSB}$.

The first unit 421 also includes a first unit switch 408 comprising one of the one or more first switches mentioned earlier. The first unit resistor 401 is coupled between the non-inverting input terminal 205 and an intermediate node 424 of the first unit 421 of the first-segment-units and the second unit resistor 402 is coupled between the intermediate node 424 and said first unit switch 408.

Each subsequent first-segment-unit 422, 423 of the one or more first-segment-units comprises a similar arrangement of "R" and "2R" resistors with the corresponding switch 409, 410. Thus, each subsequent first-segment-unit 422, 423 comprises a first unit resistor (403 in the second unit 422 of the first-segment-units; and 405 in the third unit 423 of the first-segment-units) having a resistance $R_{LSB}$ and a second unit resistor (404 in the second unit 422 of the first-segment-units; and 406 in the third unit 423 of the first-segment-units) having a resistance $2 \cdot R_{LSB}$. Also, each subsequent first-segment-unit 422, 423 comprises a subsequent unit switch comprising one of the first unit switches (409 in the second unit 422 of the first-segment-units; and 410 in the third unit 423 of the first-segment-units). In forming the chain, the first unit resistor 403, 405 of said subsequent first-segment-unit 422, 423 is coupled between the intermediate node 424, 425 of a preceding first-segment-unit in the chain and an intermediate node 425, 426 of said subsequent first-segment-unit and the second unit resistor 404, 406 of said subsequent first-segment-unit is coupled between the intermediate node 425, 426 of said subsequent first-segment-unit and the subsequent unit switch 409, 410.

Thus, considering the second unit 422 of the first-segment-units, the first unit resistor 403 of said second first-segment-unit 422 is coupled between the intermediate node 424 of the first 421 first-segment-unit and its own intermediate node 425 and the second unit resistor 404 of said second 422 first-segment-unit is coupled between the intermediate node 425 and the second unit switch 409.

Now, considering the third unit 423 of the first-segment-units, the first unit resistor 405 of said third first-segment-unit 423 is coupled between the intermediate node 425 of the second 422 first-segment-unit and its own intermediate node 426 and the second unit resistor 406 of said third 423 first-segment-unit is coupled between the intermediate node 426 and the third unit switch 410.

As mentioned previously, the first unit switch 408, second unit switch 409 and third unit switch 410, are configured to couple the respective second unit resistors 402, 404, 406 to either the first reference voltage terminal 201 or the second reference voltage terminal 202.

In this and other examples, the first segment 106 also comprises a termination resistor 407 of the plurality of first-segment-resistors having a first resistor terminal coupled to the intermediate node 426 of a final first-segment-units arranged in the chain (that is the third 423 of the first-segment-units in this example) and a second resistor terminal coupled to the first reference voltage terminal 201.

In one or more examples, the first unit resistor 401 of the first unit 421 of the one or more first-segment-units is optional. Thus, in one or more examples, the first unit 421 of the one or more first-segment-units may have a 2R resistor 402 without the "R" resistor 401 while the second 422 and third 423 and so on of the first-segment-units does have the R-2R arrangement described above.

In one or more examples, when the first segment 106 has an R-2R arrangement, the resistance $2R_{LSB}$ is equal to $R_{MSB}$.

Turning to FIG. 5, the unit-R arrangement is shown. In one or more examples, the unit-R arrangement of the first segment 106 comprises one or more first-segment-units arranged in a chain. In this example, there comprises a first unit 521 of three first-segment-units 521, 522 and 523. The second unit of the first-segment-units 521, 522 and 523 onwards are all coupled in parallel to the first unit 521 of the first-segment-units.

Thus, in one or more examples, the first unit 521 of the one or more first-segment-units comprises a first unit resistor 501 (which comprises one of the plurality of first-segment-resistors mentioned above) having a resistance $R_{UNITR}$ and a second unit resistor 502 (which comprises one of the plurality of first-segment-resistors mentioned above) having a resistance $2 \cdot R_{LSB}$ and a first unit switch 506 (which comprises one of the one or more first switches mentioned above).

The first unit resistor 501 is coupled between the non-inverting input terminal 205 and an intermediate node 524 of the first unit 521 of the first-segment-units and the second unit resistor 502 is coupled between the intermediate node 524 and said first unit switch 506. As mentioned previously, the first unit switch 506 of the first unit 521 of the one or more first-segment-units is configured to couple the respective second unit resistors 502 to either the first reference voltage terminal 201 or the second reference voltage terminal 202.

We now consider the second 522 and third 523 first-segment-units, which comprise the subsequent first-segment-unit of the one or more first-segment-units. The second 522 and third 523 first-segment-units each comprise a first unit resistor 503, 504 respectively (i.e., which comprise the resistors of the plurality of first-segment-resistors) and they each have a resistance $2 \cdot R_{LSB}$ and are coupled between the intermediate node 524 of the first unit of the first-segment-units and a subsequent unit switch, comprising the second unit switch 507 for the second 522 first-segment-unit and the third unit switch 508 for the third 523 first-segment-unit.

Further, the first segment 106 further comprises a termination resistor 505 (which comprises one of the plurality of first-segment-resistors) having a first resistor terminal coupled to the intermediate node 524 of the first unit 521 of the first-segment-units and a second resistor terminal coupled to the first reference voltage terminal 201.

The resistance $R_{UNITR}$ comprises $$\frac{2^L - 1}{2^L} \cdot 2R_{LSB}$$

wherein L comprises the number of first-segment-units 521-523, wherein L corresponds to M1 as defined above. Thus, in example FIG. 5, L=3 because there are three first-segment-units 521, 522 and 523 receiving the three lesser significant bits of the digital control word. Thus, $R_{UNITR}$ comprises $$\frac{14}{8} \cdot R_{LSB}.$$

In one or more examples, the total output impedance of the first segment 106 is equal to $R_{MSB}$.

Thus, FIGS. 4 and 5 show two alternate configurations of the first segment 106 but the second segment 107 and third segment 108 have the same layout.

In one or more examples, such as shown in example FIG. 3, the third segment 108 comprises one or more third-segment-resistors 310, 311 (two in FIG. 3) coupled directly to the first reference voltage terminal 201. In one or more examples, such as shown in example FIGS. 4 and 5, the third segment 108 comprises one or more third-segment-resistors (one shown in FIG. 4 at 431, one shown in FIG. 5 at 531) selectively coupled to the first reference voltage terminal 201 by a switch 430, 530. A controller 442, 542 may be provided to control the switch 430, 530 and thereby connect and disconnect the third-segment-resistor 431, 531 from the first reference voltage terminal 201. When disconnected, the third-segment-resistor 431, 531 is not connected to any other component. The switches 430 and 530 may be configured to couple, selectively, the one or more third-segment-resistors 431 to the first reference voltage terminal 201 such that the one or more third-segment-resistors of the third segment 108 have a total, collective, third resistance, Rsp, wherein $Rsp = R_{MSB}/2^{M2}$ wherein M2 comprises the number of bits of the digital control word provided to the binary to thermometer decoder 440, 540, wherein the binary to thermometer decoder is configured to provide an output to individually control the second switches 308 based on said digital control word. The third switches 430 may be used to provide offset trimming and/or programmable gain amplifier (PGA) gain settling.

In one or more examples, the number of third-segment-resistors 310, 311, 431, 531 in the third segment is equal to $2^{M2}$, wherein M2 is the number of units 302-304 in the second segment 107. In such an arrangement where there are $2^{M2}$ resistors in the third segment, then the resistance of each of them, is $R_{MSB}$.

In one or more examples, the third segment may be provided by a split resistor arrangement, described as follows. In one or more examples, the number of third-segment-resistors 310, 311, 431, 531 in the third segment is equal to $2^{M2}/N$, wherein M2 is the number of units 302-304 in the second segment 107 and N is an integer greater than one and wherein the resistance of each of the third-segment-resistors 310, 311, 431, 531 is $R_{MSB}/N$. Thus, if we designate $R_{MSB}/N$ as $R_{split}$ because it represents the resistance of each third-segment-resistors and comprises a unit fraction of $R_{MSB}$, then $Rsp = N \cdot R_{split}/2^{M2}$.

In one or more examples, and as shown in FIG. 4 and FIG. 5, the DAC 100 includes a binary-to-thermometer decoder 440, 540 configured to receive the digital control word from the controller (not shown). The output from the binary-to-thermometer decoder 440, 540 is configured to control the second switches 411, 412, 413, 511, 512, 513 of the second segment 107. The binary-to-thermometer decoder 440, 540 receives the most significant bit of the digital control word and the bits contiguous therewith in the digital control word, which comprise the bits of greatest significance in the digital control word. The binary-to-thermometer decoder 440, 540 outputs a number of individual control signals for controlling the number of second switches 411, 412, 413, 511, 512, 513 of the second segment 107.

In the examples in which the first segment 106 comprises a unit-R configuration, the DAC 100 includes a second binary-to-thermometer decoder 541 configured to receive the digital control word from the controller (not shown). The output from the second binary-to-thermometer decoder 541 is configured to control the first switches 506, 507, 508 of the first segment. The binary-to-thermometer decoder 541 receives the least significant bit of the digital control word and the bits contiguous therewith in the digital control word, which comprise the bits of lesser significance in the digital control word. The binary-to-thermometer decoder 541 outputs a number of individual control signals for controlling the first switches 506, 507, 508 of the first segment 106.

In the examples in which the first segment 106 comprises an R-2R configuration, the DAC 100 includes a delay equalizer 441, the delay equalizer configured to receive the control signal from the controller (not shown). The output from the delay equalizer 441 is configured to control the first switches 408, 409, 410 of the first segment 106. The digital control word received by the delay equalizer 441 comprises the least significant bit of the digital control word and the bits contiguous therewith in the digital control word, which comprise the bits of lesser significance in the digital control word. The binary-to-thermometer decoder 541 outputs a number of individual control signals for controlling the first switches 506, 507, 508 of the first segment 106. In one or more examples, the delay equalizer receives M1 bits and may provide $2^{M1}-1$ individual control signals to control the first switches 506, 507, 508.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. A digital to analog converter, DAC, comprising:
an amplifier for forming a buffer of the DAC, the amplifier comprising an inverting input terminal and a non-inverting input terminal and an output terminal for providing an output of the DAC, wherein the inverting input terminal is coupled to a first reference voltage terminal via a first resistor, the first reference voltage terminal configured to receive a first reference voltage and wherein the output terminal is coupled to the inverting input terminal via a second resistor; and
a resistor ladder arrangement coupled to the non-inverting input terminal of the amplifier and configured to generate a voltage at said non-inverting input terminal based on a digital control word, wherein the resistor ladder arrangement comprises:
i) a first segment comprising a plurality of first-segment-resistors and one or more first switches, said first segment coupled to the non-inverting input terminal of the amplifier, and each of the one or more first switches configured to individually and selectively couple a respective first-segment-resistor of the plurality of first-segment-resistors to either the first reference voltage terminal or a second reference voltage terminal that is configured to receive a second reference voltage, different from the first reference voltage, and wherein the plurality of first-segment-resistors and the one or more first switches are arranged in one of: an R-2R configuration and a unit-R configuration;
ii) a second segment comprising one or more units, each unit comprising a second-segment-resistor having a first resistor terminal and a second resistor terminal wherein the second resistor terminal is coupled to a respective second switch, wherein the one or more units are coupled, in parallel, to the non-inverting input terminal by the first resistor terminal of the second-segment-resistor of each of the one or more units, wherein each respective second switch is configured to individually and selectively couple the respective second resistor terminal to either the first reference voltage terminal or the second reference voltage terminal, wherein each second-segment-resistor of the one or more units of the second segment has a second resistance value, $R_{MSB}$;
iii) a third segment comprising one or more third-segment-resistors, each of the one or more third-segment-resistors of the third segment having a first resistor terminal and a second resistor terminal, wherein each of the one or more third-segment-resistors of the third segment are coupled in parallel to the non-inverting input terminal by their first resistor terminal and, by their second resistor terminal, are connected to the first reference voltage terminal, wherein the one or more third-segment-resistors of the third segment have a total, third resistance value based on the second resistance value and a number of bits in the digital control word for controlling said second switches of the one or more units of the second segment; and
wherein said first switches of the first segment are configured to be controlled by a first part of the digital control word comprising one or more of the least significant bits of the digital control word, and the second switches of the second segment are configured to be controlled by a second part of the digital control word comprising one or more of the most significant bits of the digital control word, and thereby control of the first switches and the second switches controls the output of the DAC at the output terminal.

2. The DAC of claim 1, wherein one of:
(a) $Rsp=R_{MSB}/2^{M2}$; and
(b) $Rsp=R_{MSB}/2^{M2} \pm$ a threshold value;
wherein Rsp comprises the third resistance value and M2 comprises the number of bits in the digital control word for controlling said second switches of the one or more units of the second segment.

3. The DAC of claim 1, wherein the R-2R arrangement of the first segment comprises one or more first-segment-units arranged in a chain, wherein
   a first of the one or more first-segment-units comprises a first unit resistor of the plurality of first-segment-resistors having a resistance $R_{LSB}$ and a second unit resistor of the plurality of first-segment-resistors having a resistance $2 \cdot R_{LSB}$, and a first unit switch comprising one of the one or more first switches, wherein the first unit resistor is coupled between the non-inverting input terminal and an intermediate node of the first of the first-segment-units and the second unit resistor is coupled between the intermediate node and said first unit switch; and
   wherein each subsequent first-segment-unit of the one or more first-segment-units comprises a first unit resistor of the plurality of first-segment-resistors having a resistance $R_{LSB}$ and a second unit resistor of the plurality of first-segment-resistors having a resistance $2 \cdot R_{LSB}$, and a subsequent unit switch comprising one of the first switches, wherein the first unit resistor of said subsequent first-segment-unit is coupled between the intermediate node of a preceding first-segment-unit in the chain and an intermediate node of said subsequent first-segment-unit and the second unit resistor of said subsequent first-segment-unit is coupled between the intermediate node of said subsequent first-segment-unit and the subsequent unit switch; and
   wherein the first segment comprises a termination resistor of the plurality of first-segment-resistors having a first resistor terminal coupled to the intermediate node of a final first-segment-units arranged in the chain and a second resistor terminal coupled to the first reference voltage terminal.

4. The DAC of claim 3, wherein the resistance $2R_{LSB}$ is equal to $R_{MSB}$.

5. The DAC of claim 1, wherein the unit-R arrangement of the first segment comprises one or more first-segment-units arranged in a chain, wherein
   a first of the one or more first-segment-units comprises a first unit resistor of the plurality of first-segment-resistors having a resistance $R_{UNITR}$ and a second unit resistor of the plurality of first-segment-resistors having a resistance $2 \cdot R_{LSB}$, and a first unit switch comprising one of the one or more first switches, wherein the first unit resistor is coupled between the non-inverting input terminal and an intermediate node of the first of the first-segment-units and the second unit resistor is coupled between the intermediate node and said first unit switch; and
   wherein each subsequent first-segment-unit of the one or more first-segment-units comprises a first unit resistor of the plurality of first-segment-resistors having a resistance $2 \cdot R_{LSB}$ coupled between the intermediate node of the first of the first-segment-units and a subsequent unit switch of the one or more first switches; and
   wherein the first segment further comprises a termination resistor of the plurality of first-segment-resistors having a first resistor terminal coupled to the intermediate node of the first of the first-segment-units and a second resistor terminal coupled to the first reference voltage terminal.

6. The DAC of claim 5, wherein the resistance $R_{UNITR}$ comprises $$\frac{2^L - 1}{2^L} \cdot 2R_{LSB}$$

wherein L comprises the number of first-segment-units.

7. The DAC of claim 1, wherein the total output impedance of the first segment is equal to $R_{MSB}$.

8. The DAC of claim 1, wherein the number of third-segment-resistors in the third segment is equal to $2^{M2}$.

9. The DAC of claim 1, wherein the number of third-segment-resistors in the third segment is equal to $2^{M2}/N$, wherein N is an integer greater than one and wherein the resistance of each of the third-segment-resistors is $R_{MSB}/N$.

10. The DAC of claim 1, wherein the amplifier is configured to be powered by virtue of being coupled to a third voltage reference terminal and a fourth voltage reference terminal, wherein the third voltage reference terminal is configured to receive a supply voltage equal to or greater than the second reference voltage and the fourth voltage reference terminal is configured to receive a ground reference voltage and the first reference voltage is equal to or greater than the ground reference voltage.

11. The DAC of claim 10, wherein the fourth voltage reference terminal is configured to be coupled to a ground reference voltage and a resistance of the first resistor of the buffer is equal to a resistance of the second resistor of the buffer.

12. The DAC of claim 1, wherein the DAC includes a binary-to-thermometer decoder configured to receive the second part of the digital control word, the output from the binary-to-thermometer decoder configured to control the second switches of the second segment.

13. The DAC of claim 12, wherein the first segment comprises a unit-R configuration and the DAC includes a second binary-to-thermometer decoder configured to receive the first part of the digital control word, the output from the second binary-to-thermometer decoder configured to control the first switches of the first segment.

14. The DAC of claim 1, wherein the first segment comprises an R-2R configuration and the DAC includes a delay equalizer, the delay equalizer configured to receive the first part of the digital control word from the controller, the output from the delay equalizer configured to control the first switches of the first segment.

15. The DAC of claim 1, wherein at least one of the one or more third-segment-resistors has its second resistor terminal coupled to the first reference voltage terminal via a third switch, the third switch configured to selectively connect or disconnect the at least one or more third resistors from the first reference voltage terminal.

16. The DAC of claim 9, wherein N is greater than 3.

17. The DAC of claim 1, wherein the third segment comprises two or more third-segment-resistors.

18. The DAC of claim 1, wherein one of the plurality of first-segment-resistors comprises a termination resistor and the remaining resistors of the plurality of first-segment-resistors form the one of the R-2R configuration and the unit-R configuration with the one or more first switches, wherein the termination resistor comprises a first resistor terminal coupled to the one of the R-2R configuration and the unit-R configuration and comprises a second resistor terminal coupled to the first reference voltage terminal.

19. The DAC of claim 1, wherein the amplifier is configured such that the voltage provided at the output terminal, VO_DAC, is as follows:

VO_DAC=(Rfb1/(Rfb1+Rfb2))*VO_LADDER wherein Rfb1 is the resistance of the first resistor, Rfb2 is the resistance of the second resistor and VO_LADDER is the voltage provided to the non-inverting input by the resistor ladder arrangement.

\* \* \* \* \*